(12) United States Patent
Gokita

(10) Patent No.: US 11,442,120 B2
(45) Date of Patent: Sep. 13, 2022

(54) MAGNETIC SENSOR WITH COMPENSATION COIL FOR CANCELLING MAGNETIC FLUX APPLIED TO A MAGNETO-SENSITIVE ELEMENT

(71) Applicant: TDK Corporation, Tokyo (JP)

(72) Inventor: Takeo Gokita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/981,146

(22) PCT Filed: Mar. 11, 2019

(86) PCT No.: PCT/JP2019/009672
§ 371 (c)(1),
(2) Date: Sep. 15, 2020

(87) PCT Pub. No.: WO2019/188186
PCT Pub. Date: Oct. 3, 2019

(65) Prior Publication Data
US 2021/0116518 A1   Apr. 22, 2021

(30) Foreign Application Priority Data
Mar. 29, 2018 (JP) .............................. JP2018-063795

(51) Int. Cl.
*G01R 33/00* (2006.01)
*G01R 33/09* (2006.01)
(Continued)

(52) U.S. Cl.
CPC ........... *G01R 33/09* (2013.01); *G01R 33/025* (2013.01); *G01R 15/185* (2013.01); *G01R 33/0017* (2013.01)

(58) Field of Classification Search
CPC .... G01R 33/02; G01R 33/025; G01R 15/185; G01R 33/0011; G01R 33/09
See application file for complete search history.

(56) References Cited

U.S. PATENT DOCUMENTS

| 2004/0155644 A1* | 8/2004 | Stauth | ................... G01R 15/207 324/117 R |
| 2010/0164823 A1* | 7/2010 | Kubo | ....................... H01Q 7/08 343/788 |

(Continued)

FOREIGN PATENT DOCUMENTS

| JP | 2012-247420 A | 12/2012 |
| JP | 5572208 B2 | 8/2014 |

(Continued)

OTHER PUBLICATIONS

International Search Report issued in corresponding International Patent Application No. PCT/JP2019/009672, dated May 7, 2019, with English translation.

(Continued)

*Primary Examiner* — Alesa Allgood
(74) *Attorney, Agent, or Firm* — McDermott Will & Emery LLP

(57) ABSTRACT

An object of the present invention is to provide a magnetic sensor capable of detecting a magnetic field to be measured through closed loop control even when the magnetic field is weak. A magnetic sensor includes magnetic layers 41 and 42 opposed to each other through a magnetic gap G1, a magneto-sensitive element R1 disposed on a magnetic path formed by the magnetic gap G1, and a compensation coil 60 generating canceling magnetic flux $\phi 4$ to cancel magnetic flux $\phi 2$ applied to the magneto-sensitive element R1. According to the present invention, magnetic flux $\phi 2$ flowing in the magnetic layers 41 and 42 each functioning as a yoke is applied to the magneto-sensitive element R1, so that even when a magnetic field to be measured is weak, it can be detected.

(Continued)

In addition, closed loop control can be performed due to the presence of the compensation coil 60 that cancels magnetic flux $\phi 2$.

2 Claims, 8 Drawing Sheets

(51) Int. Cl.
  *G01R 33/025* (2006.01)
  *G01R 15/18* (2006.01)

(56) References Cited

U.S. PATENT DOCUMENTS

| | | | |
|---|---|---|---|
| 2012/0306486 A1* | 12/2012 | Racz | G01R 15/20 |
| | | | 324/251 |
| 2012/0326715 A1 | 12/2012 | Ide et al. | |
| 2014/0266185 A1* | 9/2014 | Sidman | G01R 33/0005 |
| | | | 324/252 |
| 2017/0322051 A1 | 11/2017 | Nobira et al. | |
| 2018/0372812 A1 | 12/2018 | Kawasaki et al. | |

FOREIGN PATENT DOCUMENTS

| | | |
|---|---|---|
| WO | 2017/169156 A1 | 10/2017 |
| WO | 2017/204151 A1 | 11/2017 |
| WO | 2017/211279 A1 | 12/2017 |

OTHER PUBLICATIONS

Extended European Search Report issued on corresponding European Patent Application No. 19775807.1-1010, dated Nov. 22, 2021.

* cited by examiner

MAGNETIC SENSOR WITH COMPENSATION COIL FOR CANCELLING MAGNETIC FLUX APPLIED TO A MAGNETO-SENSITIVE ELEMENT

CROSS REFERENCE TO RELATED APPLICATIONS

This application is the U.S. National Phase under 35 U.S.C. § 371 of International Application No. PCT/JP2019/009672, filed on Mar. 11, 2019, which claims the benefit of Japanese Application No. 2018-063795, filed on Mar. 29, 2018, the entire contents of each are hereby incorporated by reference.

TECHNICAL FIELD

The present invention relates to a magnetic sensor and, more particularly to a magnetic sensor having a compensation coil for cancelling magnetic flux to be applied to a magneto-sensitive element.

BACKGROUND ART

There is known a magnetic sensor of a type having a compensation coil for canceling magnetic flux to be applied to a magneto-sensitive element to perform closed loop control. For example, a magnetic sensor described in Patent Document 1 has a magneto-sensitive element, a magnetic shield that shields a magnetic field to be measured, and a compensation coil disposed between the magnetic shield and the magneto-sensitive element. The magnetic shield plays a role of attenuating a magnetic field to be applied to the magneto-sensitive element, whereby it is possible to reduce a current to flow in the compensation coil even when a magnetic field to be measured is strong.

CITATION LIST

Patent Document

[Patent Document 1] Japanese Patent No. 5,572,208

SUMMARY OF INVENTION

Problem to be Solved by the Invention

However, in the magnetic sensor described in Patent Document 1, a magnetic field to be measured is attenuated by the magnetic shield, so that when the magnetic field to be measured is weak, measurement thereof becomes difficult.

It is therefore an object of the present invention to provide a magnetic sensor capable of detecting a magnetic field to be measured through closed loop control even when the magnetic field is weak.

Means for Solving the Problem

A magnetic sensor according to the present invention includes first and second magnetic layers opposed to each other through a first magnetic gap, a first magneto-sensitive element disposed on a magnetic path formed by the first magnetic gap, and a compensation coil for canceling magnetic flux to be applied to the first magneto-sensitive element.

According to the present invention, magnetic flux flowing in the first and second magnetic layers each functioning as a yoke is applied to the magneto-sensitive element, so that even when a magnetic field to be measured is weak, it can be detected. In addition, closed loop control can be performed due to the presence of the compensation coil that cancels magnetic flux.

In the present invention, the first magnetic layer may be disposed at a position overlapping the inner diameter area of the compensation coil in a plan view, and the second magnetic layer may be disposed at a position overlapping the outside area of the compensation coil in a plan view. With this configuration, a canceling magnetic field directed from the first magnetic layer to the second magnetic layer through the first gap, or directed from the second magnetic layer to the first magnetic layer through the first magnetic gap can be generated.

The magnetic sensor according to the present invention may further include an external magnetic member that collects external magnetic flux to be measured in the first magnetic layer. This allows the external magnetic flux to be collected efficiently in the first magnetic layer.

The magnetic senor according to the present invention may further include a third magnetic layer opposed to the first magnetic layer through a second magnetic gap and a second magneto-sensitive element disposed on a magnetic path formed by the second magnetic gap, the compensation coil may cancel magnetic flux to be applied to the second magneto-sensitive element, and the third magnetic layer may be disposed at a position overlapping the outside area of the compensation coil in a plan view. With this configuration, magnetic fields in opposite directions are given to the first and second magneto-sensitive elements, so that it is possible to achieve higher detection sensitivity by bridge-connecting the first and second magneto-sensitive elements.

In the present invention, the first to third magnetic layers, the first and second magneto-sensitive elements, and the compensation coil may be all provided on a sensor substrate. With this configuration, it is possible to constitute a magnetic sensor having high detection sensitivity simply by disposing the external magnetic member on the sensor substrate.

In the present invention, the first and second magneto-sensitive elements may be formed between the compensation coil and the first to third magnetic layers in the lamination direction on the sensor substrate. With this configuration, it is possible to reduce the distance between the first to third magnetic layers and the first and second magneto-sensitive elements, and to reduce the size of the magnetic gap formed between the external magnetic member and the first magnetic layer.

In the present invention, the first to third magnetic layers may be formed between the compensation coil and the first and second magneto-sensitive elements in the lamination direction on the sensor substrate. With this configuration, it is possible to reduce the distance between the first to third magnetic layers and the first and second magneto-sensitive elements, and to reduce the distance between the compensation coil and the first to third magnetic layers, allowing a current flowing in the compensation coil to be further reduced.

In the present invention, the compensation coil may be wound over a plurality of wiring layers on the sensor substrate. With this configuration, it is possible to enhance the freedom of the layout of a conductor pattern constituting the compensation coil.

Advantageous Effects of the Invention

As described above, according to the present invention, it is possible to detect a magnetic field to be measured with high sensitivity through closed loop control even when the magnetic field is weak.

MODE FOR CARRYING OUT THE INVENTION

Preferred embodiments of the present invention will be explained below in detail with reference to the accompanying drawings.

Figure 1:
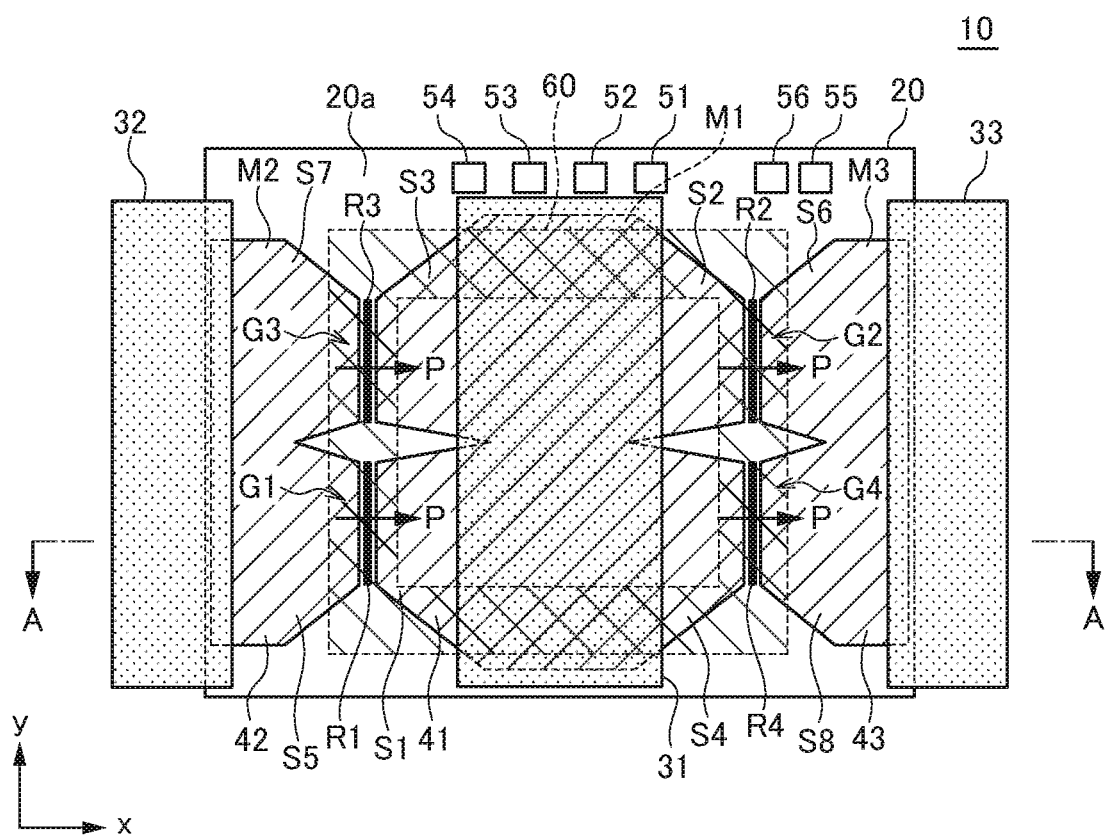
FIG. 1 is a schematic plan view for explaining the structure of a magnetic sensor 10 according to a preferred embodiment of the present invention.
Figure 2:
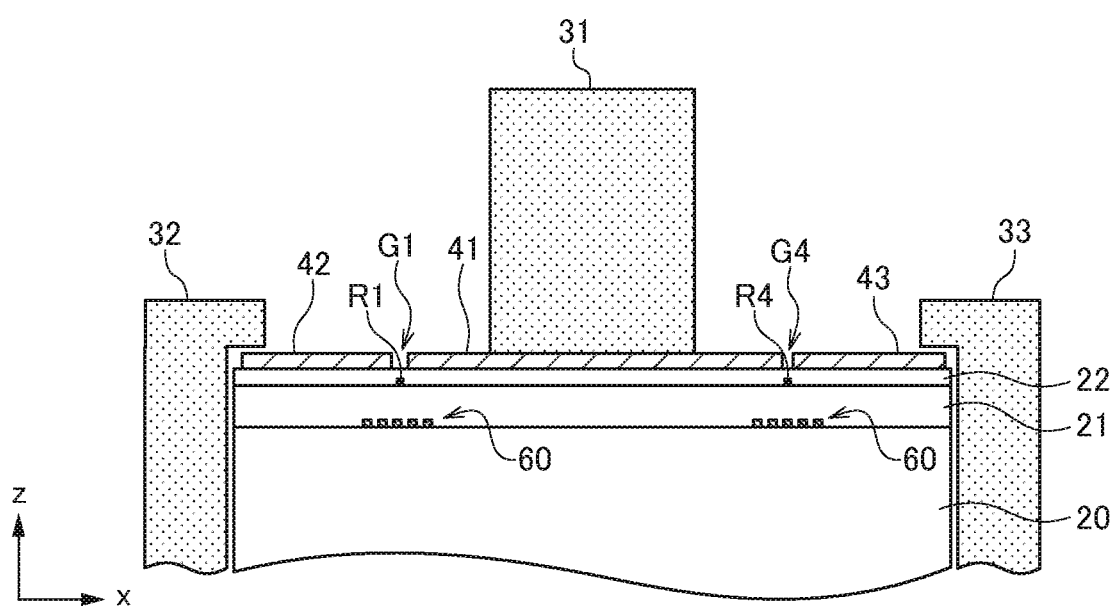
FIG. 2 is a schematic cross-sectional view taken along line A-A in FIG. 1.

FIG. 1 is a schematic plan view for explaining the structure of a magnetic sensor 10 according to a preferred embodiment of the present invention. FIG. 2 is a schematic cross-sectional view taken along line A-A in FIG. 1.

As illustrated in FIGS. 1 and 2, the magnetic sensor 10 according to the present embodiment has a sensor substrate 20 and external magnetic members 31 to 33. The sensor substrate 20 is a chip component having a substantially rectangular parallelepiped shape. On an element formation surface 20a of the sensor substrate 20, magneto-sensitive elements R1 to R4, magnetic layers 41 to 43, terminal electrodes 51 to 56, and a compensation coil 60 are provided. The terminal electrodes 51 to 56 are connected to a not-shown circuit board through, e.g., a bonding wire.

In the present embodiment, the compensation coil 60, the magneto-sensitive elements R1 to R4, and the magnetic layers 41 to 43 are stacked in this order on the element formation surface 20a. The compensation coil 60 and the magneto-sensitive elements R1 to R4 are isolated by an insulating film 21, and the magneto-sensitive elements R1 to R4 and the magnetic layers 41 to 43 are isolated by an insulating film 22.

The external magnetic members 31 to 33 are each a block made of a soft magnetic material having a high permeability, such as ferrite. The external magnetic member 31 is disposed at substantially the center of the element formation surface 20a and has a shape protruding in the z-direction. The external magnetic members 32 and 33 are disposed on both sides of the sensor substrate 20 in the x-direction and each have a tip end bent in an L-shape to cover the element formation surface 20a.

The first to third magnetic layers 41 to 43 are formed on the insulating film 22 of the sensor substrate 20. The first magnetic layer 41 is positioned at substantially the center of the element formation surface 20a, and the second and third magnetic layers 42 and 43 are disposed on both sides of the first magnetic layer 41 in the x-direction. Although not particularly restricted, the magnetic layers 41 to 43 may each be a film made of a composite magnetic material obtained by dispersing magnetic filler in a resin material, may be a thin film or a foil made of a soft magnetic material such as nickel or permalloy, or may be a thin film or a bulk sheet made of ferrite.

The first magnetic layer 41 is positioned at the center and includes a main area M1 covered with the external magnetic member 31 and convergence areas S1 to S4 whose widths in the y-direction are reduced with increasing distance from the main area M1 in the x-direction. As illustrated in FIG. 1, the convergence areas S1 and S3 are positioned at the negative side (left side) in the x-direction with respect to the main area M1, and the convergence areas S2 and S4 are positioned at the positive side (right side) in the x-direction with respect to the main area M1. The first magnetic layer 41 and the external magnetic member 31 may contact each other directly or through a thin insulating film or an adhesive layer.

The second magnetic layer 42 includes a main area M2 covered with the external magnetic member 32 and convergence areas S5 and S7 whose widths in the y-direction are reduced with increasing distance from the main area M2 in the x-direction (positive side). Similarly, the third magnetic layer 43 includes a main area M3 covered with the external magnetic member 33 and convergence areas S6 and S8 whose widths in the y-direction are reduced with increasing distance from the main area M3 in the x-direction (negative side).

The external magnetic member 31 plays a role of capturing z-direction external magnetic flux. The magnetic flux captured through the external magnetic member 31 enters the main area M1 of the first magnetic layer 41 and is then distributed to the convergence areas S1 to S4 substantially evenly. The magnetic fluxes that have reached the convergence areas S1 to S4 are supplied to the convergence areas S5 to S8 respectively through their corresponding magnetic gaps G1 to G4 extending in the y-direction. The magnetic fluxes that have reached the convergence areas S5 and S7 are collected by the external magnetic member 32 through the main area M2. Similarly, the magnetic fluxes that have reached the convergence areas S6 and S8 are collected by the external magnetic member 33 through the main area M3.

As illustrated in FIG. 1, the magneto-sensitive elements R1 to R4 elongated in the y-direction are disposed respectively on magnetic paths formed by the magnetic gaps G1 to G4. The magneto-sensitive elements R1 to R4 may be disposed in the magnetic gaps G1 to G4; alternatively, they may be disposed outside the magnetic gaps G1 to G4 as long as they are each positioned within the magnetic path formed by the magnetic gap. Further, the width direction of each of the magnetic gaps G1 to G4 may be the x-direction; alternatively, it may have a z-direction component as long as magnetic flux having an x-direction component can be applied to each of the magneto-sensitive elements R1 to R4.

While there is no particular restriction on the magneto-sensitive elements R1 to R4 as long as they are elements whose physical property changes depending on a magnetic flux density, they are preferably magneto-resistive elements whose electric resistance changes according to the direction of a magnetic field. In the present embodiment, the magneto-sensitive directions (fixed magnetization directions) of the magneto-sensitive elements R1 to R4 are all oriented in a direction (positive x-direction) denoted by the arrow P in FIG. 1.

With the above configuration, the magnetic flux collected in the main area M1 of the first magnetic layer 41 through the external magnetic member 31 is distributed substantially evenly through the magneto-sensitive elements R1 to R4. Thus, magnetic fluxes in mutually opposite directions are given to the side of the magneto-sensitive elements R1 and R3 and the side of the magneto-sensitive elements R2 and R4. As described above, the fixed magnetization directions of the magneto-sensitive elements R1 to R4 are all oriented in the positive x-direction denoted by the arrow P, so that they have sensitivity with respect to an x-direction component of the magnetic flux.

Further, the compensation coil 60 is provided below the magneto-sensitive elements R1 to R4. The compensation coil cancels the magnetic flux to be applied to the magneto-sensitive elements R1 to R4 and is used for closed loop control.

Figure 3:
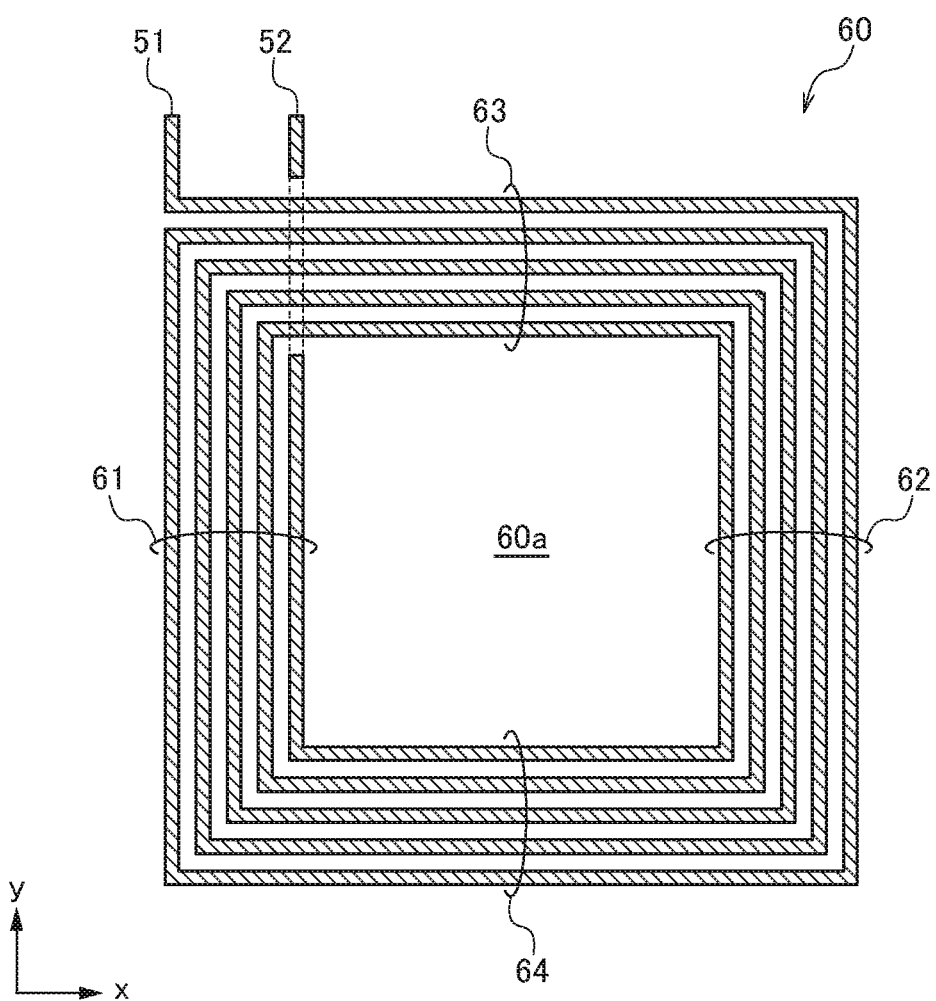
FIG. 3 is a schematic plan view for explaining the shape of the compensation coil 60.

FIG. 3 is a schematic plan view for explaining the shape of the compensation coil 60.

As illustrated in FIG. 3, the compensation coil 60 is constituted by a conductor pattern having five turns and includes conductor patterns 61 and 62 extending in the y-direction and conductor patterns 63 and 64 extending in the x-direction. One end of the compensation coil 60 is connected to the terminal electrode 51, and the other end thereof is connected to the terminal electrode 52. The number of the turns of the compensation coil 60 is not limited to five.

The positional relationship between the compensation coil 60 and the first to third magnetic layers 41 to 43 in a plan view is as illustrated in FIG. 1. That is, the first magnetic layer 41 is disposed at a position overlapping an inner diameter area 60a of the compensation coil 60 in a plan view, the second and third magnetic layers 42 and 43 are each disposed at a position overlapping the outside area of the compensation coil 60 in a plan view. The magnetic gaps G1 and G3 and the magneto-sensitive elements R1 and R3 are each disposed at a position overlapping the conductor pattern 61 of the compensation coil 60 in a plan view, and the magnetic gaps G2 and G4 and the magneto-sensitive elements R2 and R4 are each disposed at a position overlapping the conductor pattern 62 of the compensation coil 60 in a plan view.

Figure 4:
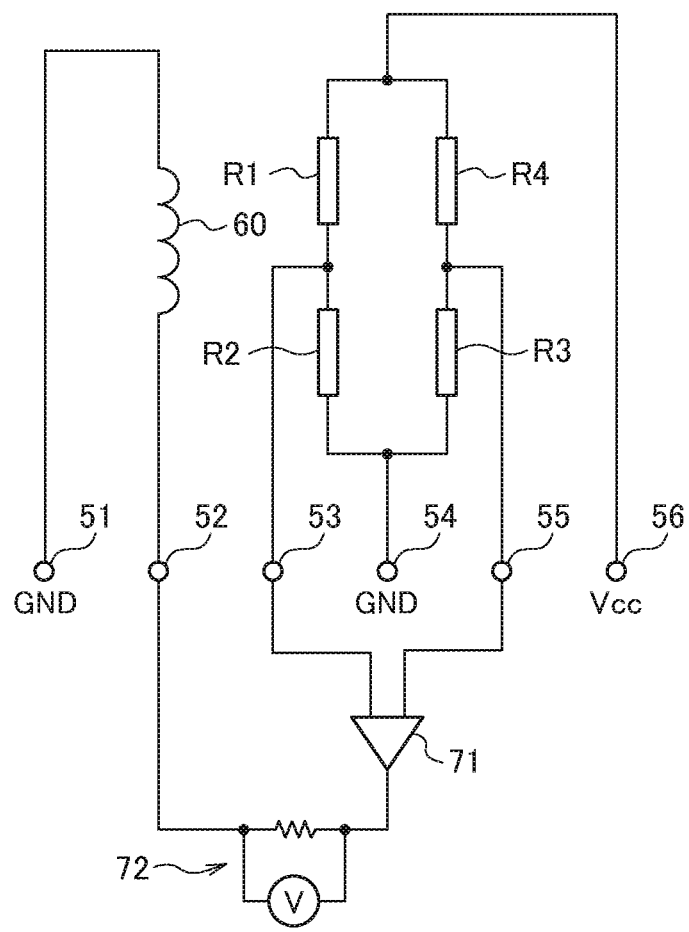
FIG. 4 is a circuit diagram for explaining the connection relationship between the terminal electrodes 51 to 56, the magneto-sensitive elements R1 to R4, and the compensation coil 60.

FIG. 4 is a circuit diagram for explaining the connection relationship between the terminal electrodes 51 to 56, the magneto-sensitive elements R1 to R4, and the compensation coil 60.

As illustrated in FIG. 4, the magneto-sensitive element R1 is connected between the terminal electrodes 53 and 56, the magneto-sensitive element R2 is connected between the terminal electrodes 53 and 54, the magneto-sensitive element R3 is connected between the terminal electrodes 54 and 55, and the magneto-sensitive element R4 is connected between the terminal electrodes 55 and 56. The terminal electrode 56 is applied with a power source potential Vcc, and the terminal electrode 54 is applied with a ground potential GND. Since the magneto-sensitive elements R1 to R4 have the same fixed magnetization direction, a difference is generated between a resistance variation of the magneto-sensitive elements R1 and R3 positioned on one side as viewed from the external magnetic member 31 and a resistance variation of the magneto-sensitive elements R2 and R4 positioned on the other side as viewed from the external magnetic member 31. As a result, the magneto-sensitive elements R1 to R4 constitute a differential bridge circuit, and a change in electric resistance of the magneto-sensitive elements R1 to R4 according to a magnetic flux density appears in the terminal electrodes 53 and 55.

Differential signals output from the terminal electrodes 53 and 55 are input to a differential amplifier 71 provided on a mounting substrate on which the magnetic sensor 10 according to the present embodiment is mounted. An output signal from the differential amplifier 71 is fed back to the terminal electrode 52. As illustrated in FIG. 4, the compensation coil 60 is connected between the terminal electrodes 51 and 52 and thus generates a canceling magnetic field according to the output signal from the differential amplifier 71. Thus, when a change in electric resistance of the magneto-sensitive elements R1 to R4 according to the magnetic flux density of the external magnetic flux appears in the terminal electrodes 53 and 55, a current corresponding to the electric resistance change flows in the compensation coil 60 to generate magnetic flux in the opposite direction, whereby the external magnetic flux is canceled. Then, by converting the current output from the differential amplifier 71 into voltage using a detection circuit 72, the strength of the external magnetic flux can be detected.

Figure 5:
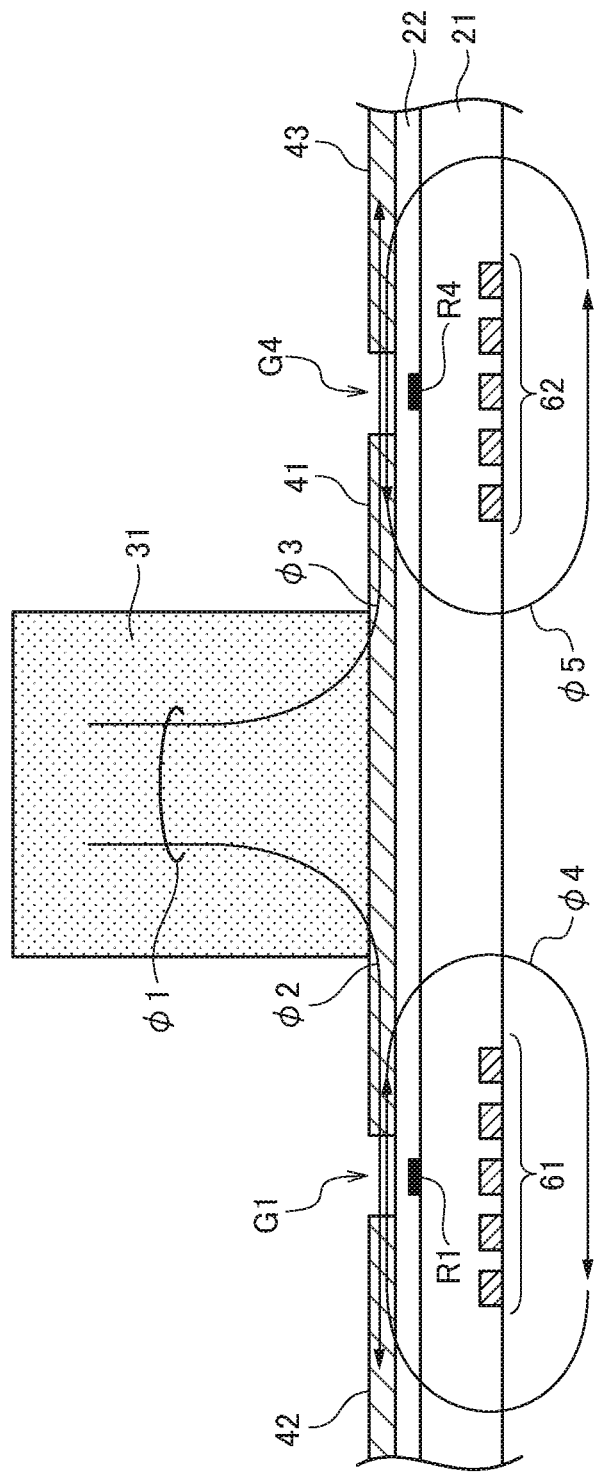
FIG. 5 is a schematic view for explaining the relationship between the external magnetic flux and the cancelling magnetic flux.

FIG. 5 is a schematic view for explaining the relationship between the external magnetic flux and the cancelling magnetic flux.

In the example of FIG. 5, an external magnetic flux φ1 in the z-direction is captured in the external magnetic member 31 and is then distributed to the left and right sides through the magnetic layer 41. A magnetic flux φ2 distributed to the left side flows in the second magnetic layer 42 through the magnetic gaps G1 and G3, and a magnetic flux φ3 distributed to the right side flows in the third magnetic layer 43 through the magnetic gaps G2 and G4. At this time, a part of the magnetic flux φ2 that flows through the magnetic gaps G1 and G3 is applied to the magneto-sensitive elements R1 and R3, and a part of the magnetic flux φ3 that flows through the magnetic gaps G2 and G4 is applied to the magneto-sensitive elements R2 and R4. Thus, as described using FIG. 4, a potential difference appears between the terminal electrodes 53 and 55 by the differential bridge circuit constituted by the magneto-sensitive elements R1 to R4.

The potential difference between the terminal electrodes 53 and 55 is fed back to the terminal electrode 52, whereby a current flows in the compensation coil 60. In the example of FIG. 5, a cancelling magnetic flux φ4 rotating clockwise around the conductor pattern 61 of the compensation coil 60 and a cancelling magnetic flux φ5 rotating counterclockwise around the conductor pattern 62 of the compensation coil 60 are generated. The cancelling magnetic flux φ4 flows from the second magnetic layer 42 to the first magnetic layer 41 through the magnetic gaps G1 and G3 to cancel the external magnetic flux φ2. The cancelling magnetic flux φ5 flows from the third magnetic layer 43 to the first magnetic layer 41 through the magnetic gaps G2 and G4 to cancel the external magnetic flux φ3.

Since the external magnetic flux φ1 captured in the external magnetic member 31 is canceled through such closed loop control, it is possible to detect the strength of the external magnetic flux φ1 by monitoring a current flowing in the compensation coil 60, i.e., a voltage appearing in the detection circuit 72.

In the present embodiment, the compensation coil 60, magneto-sensitive elements R1 to R4, and the magnetic layers 41 to 43 are stacked in this order on the sensor substrate 20, so that it is possible to reduce the distance between the magnetic layers 41 to 43 and the magneto-sensitive elements R1 to R4 in the z-direction. This allows the magnetic fluxes passing through the magnetic gaps G1 to G4 to be applied efficiently to the magneto-sensitive elements R1 to R4, thereby achieving high detection sensitivity. In addition, the size of the magnetic gap formed between the external magnetic member 31 and the first magnetic layer 41 can be reduced, thereby allowing the external magnetic flux φ1 captured in the external magnetic member 31 to be supplied efficiently to the first magnetic layer 41.

As described above, in the magnetic sensor 10 according to the present embodiment, the magneto-sensitive elements R1 to R4 are disposed respectively on the magnetic paths formed by the magnetic gaps G1 to G4, so that even a magnetic field to be measured is weak, it can be detected with high sensitivity. In addition, not only the magneto-sensitive elements R1 to R4 and magnetic layers 41 to 43, but also the compensation coil 60 is provided on the sensor substrate 20, so that it is possible to constitute a magnetic sensor having high detection sensitivity simply by disposing the external magnetic member 31 on the sensor substrate 20.

Figure 6:
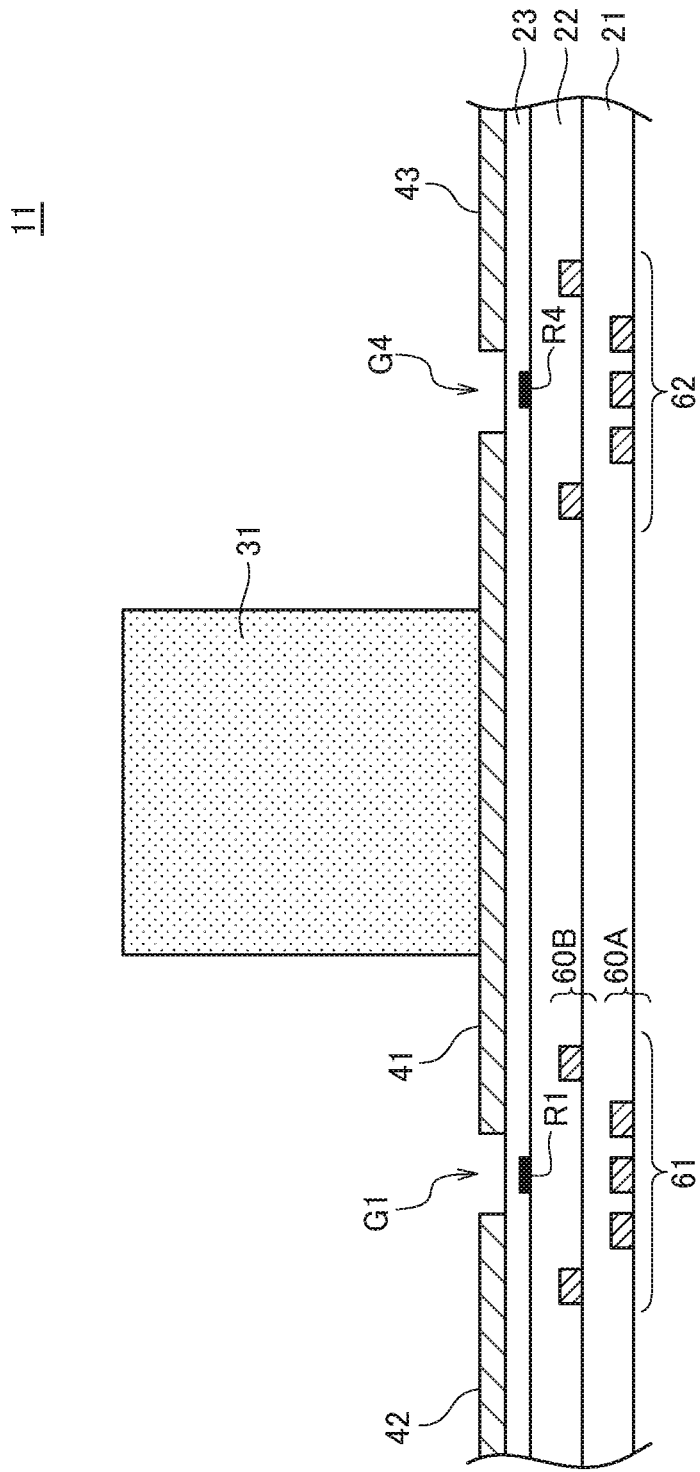
FIG. 6 is a schematic cross-sectional view illustrating the configuration of the main part of a magnetic sensor 11 according to a first modification.

FIG. 6 is a schematic cross-sectional view illustrating the configuration of the main part of a magnetic sensor 11 according to a first modification.

Figure 7:
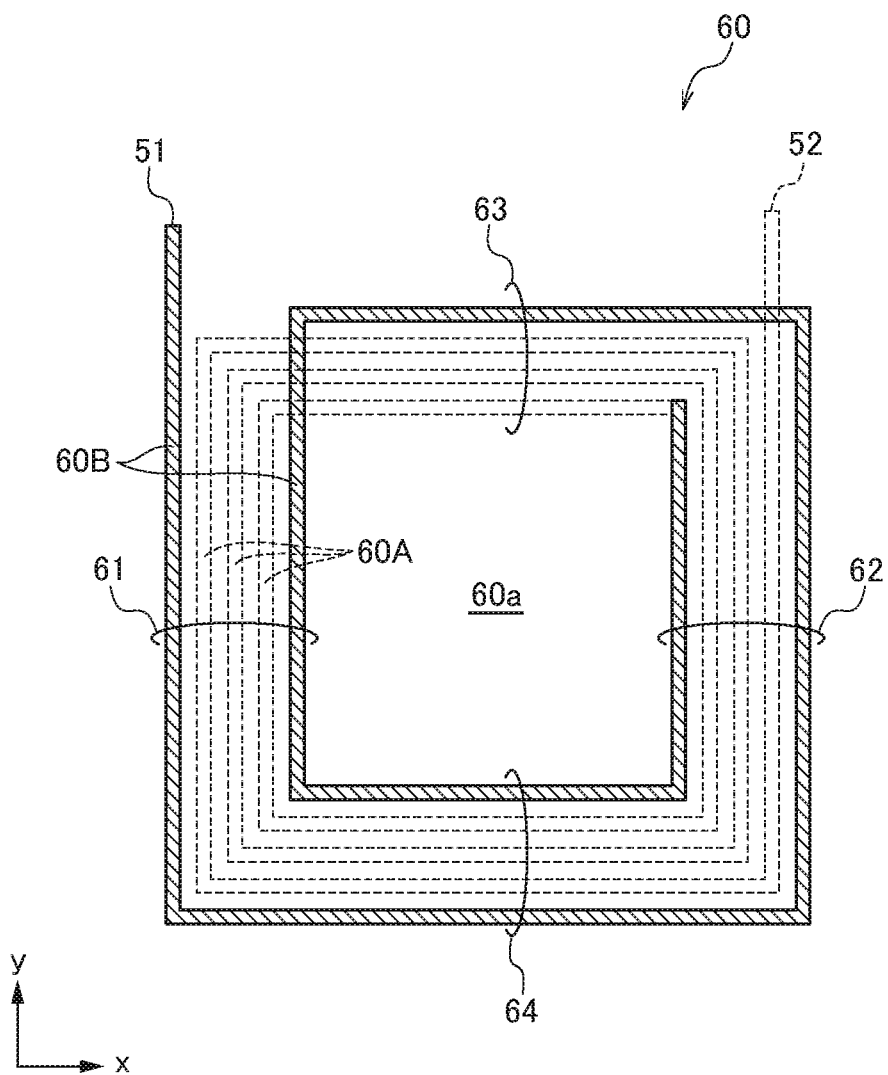
FIG. 7 is a schematic plan view for explaining a shape of the compensation coil 60 constituting a conductor pattern 60A in the lower layer and the conductor pattern 60B in the upper layer.

The magnetic sensor 11 illustrated in FIG. 6 differs from the magnetic sensor 10 according to the above embodiment in that the compensation coil 60 is wound over a plurality wiring layers. Specifically, the compensation coil 60 is constituted by a conductor pattern 60A of the lower layer and a conductor pattern 60B of the upper layer. The conductor pattern 60A in the lower layer is covered with an insulating film 21, the conductor pattern 60B in the upper layer is covered with an insulating film 22, and the magneto-sensitive elements R1 to R4 are covered with an insulating film 23. With this configuration, it is possible to enhance the freedom of the layout of the conductor pattern constituting the compensation coil 60. For example, as illustrated in FIG. 7, when the conductor pattern 60A in the lower layer and the conductor pattern 60B in the upper layer are wound in mutually opposite directions, and the inner peripheral ends thereof are connected to each other, it is possible to easily connect both ends of the compensation coil 60 to the terminal electrodes 51 and 52, respectively. In the example illustrated in FIG. 7, when a current is made to flow from the terminal electrode 51 to the terminal electrode 52, the current flows counterclockwise; however, as in the example illustrated in FIG. 3, the compensation coil 60 may be wound such that a current flows clockwise.

Figure 8:
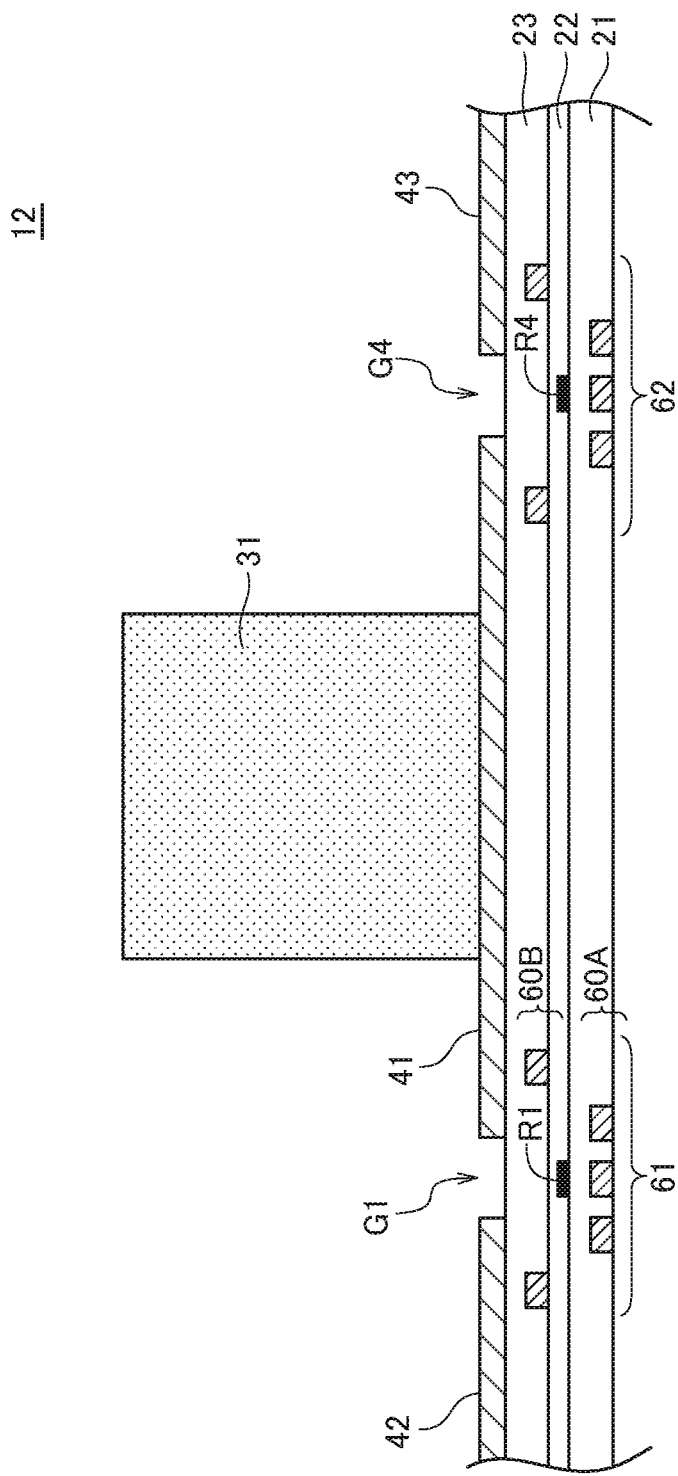
FIG. 8 is a schematic cross-sectional view illustrating the configuration of the main part of a magnetic sensor 12 according to a second modification.

FIG. 8 is a schematic cross-sectional view illustrating the configuration of the main part of a magnetic sensor 12 according to a second modification.

The magnetic sensor 12 illustrated in FIG. 8 differs from the magnetic sensor 11 according to the first modification in that the magneto-sensitive elements R1 to R4 are positioned between the conductor pattern 60A of the lower layer and the conductor pattern 60B of the upper layer. The conductor pattern 60A of the lower layer is covered with the insulating film 21, the magneto-sensitive elements R1 to R4 are covered with the insulating film 22, and the conductor pattern 60B of the upper layer is covered with the insulating film 23. When the compensation coil 60 is thus wound over a plurality of wiring layers, the magneto-sensitive elements R1 to R4 may be sandwiched by the compensation coil 60 in the stacking direction.

Figure 9:
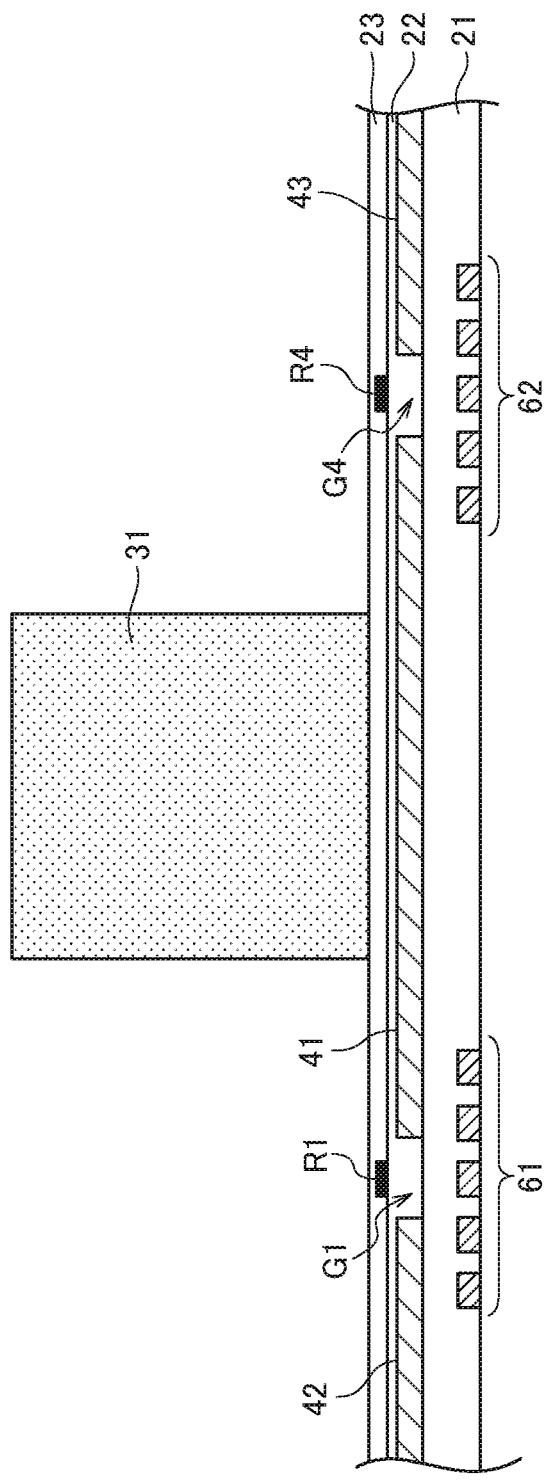
FIG. 9 is a schematic cross-sectional view illustrating the configuration of the main part of a magnetic sensor 13 according to a third modification.

FIG. 9 is a schematic cross-sectional view illustrating the configuration of the main part of a magnetic sensor 13 according to a third modification.

The magnetic sensor 13 illustrated in FIG. 9 differs from the magnetic sensor 10 according to the above embodiment in that the positional relationship between the magneto-sensitive elements R1 to R4 and the magnetic layers 41 to 43 is reversed. The compensation coil 60 is covered with the insulating film 21, the magnetic layers 41 to 43 are covered with the insulating film 22, and the magneto-sensitive elements R1 to R4 are covered with the insulating film 23. With this configuration, the distance between the compensation coil 60 and the magnetic layers 41 to 43 in the z-direction can be reduced, thereby allowing a current flowing in the compensation coil 60 to be further reduced.

While the preferred embodiments of the present invention have been described, the present invention is not limited to the above embodiments, and various modifications may be made within the scope of the present invention, and all such modifications are included in the present invention.

REFERENCE SIGNS LIST

10-13 magnetic sensor
20 sensor substrate
20a element formation surface
21-23 insulating film
31-33 external magnetic member
41 first magnetic layer
42 second magnetic layer
43 third magnetic layer
51-56 terminal electrode
60 compensation coil
60A conductor pattern
60B conductor pattern
60a inner diameter area
61-64 conductor pattern
71 differential amplifier
72 detection circuit
G1-G4 magnetic gap
M1-M3 main area
R1-R4 magneto-sensitive element
S1-S8 convergence area
φ1-φ3 external magnetic flux
φ4, φ5 cancelling magnetic flux

What is claimed is:

1. A magnetic sensor comprising:
   first and second magnetic layers opposed to each other through a first magnetic gap;
   a first magneto-sensitive element disposed on a magnetic path formed by the first magnetic gap; and
   a compensation coil for canceling magnetic flux to be applied to the first magneto-sensitive element,
   wherein the first magnetic layer is disposed at a position overlapping an inner diameter area of the compensation coil in a plan view,
   wherein the second magnetic layer is disposed at a position overlapping an outside area of the compensation coil in a plan view,
   wherein the magnetic sensor further comprises
      an external magnetic member that collects external magnetic flux to be measured in the first magnetic layer.

a third magnetic layer opposed to the first magnetic layer through a second magnetic gap; and a second magneto-sensitive element disposed on a magnetic path formed by the second magnetic gap, wherein the compensation coil cancels magnetic flux to be applied to the second magneto-sensitive element, wherein the third magnetic layer is disposed at a position overlapping the outside area of the compensation coil in a plan view, wherein the first to third magnetic layers, the first and second magneto-sensitive elements, and the compensation coil are all provided on a sensor substrate, and wherein the first and second magneto-sensitive elements are formed between the compensation coil and the first to third magnetic layers in a lamination direction on the sensor substrate.

2. A magnetic sensor comprising:

first and second magnetic layers opposed to each other through a first magnetic gap;

a first magneto-sensitive element disposed on a magnetic path formed by the first magnetic gap; and a compensation coil for canceling magnetic flux to be applied to the first magneto-sensitive element, wherein the first magnetic layer is disposed at a position overlapping an inner diameter area of the compensation coil in a plan view, wherein the second magnetic layer is disposed at a position overlapping an outside area of the compensation coil in a plan view, wherein the magnetic sensor further comprises an external magnetic member that collects external magnetic flux to be measured in the first magnetic layer.

a third magnetic layer opposed to the first magnetic layer through a second magnetic gap; and a second magneto-sensitive element disposed on a magnetic path formed by the second magnetic gap, wherein the compensation coil cancels magnetic flux to be applied to the second magneto-sensitive element, wherein the third magnetic layer is disposed at a position overlapping the outside area of the compensation coil in a plan view, wherein the first to third magnetic layers, the first and second magneto-sensitive elements, and the compensation coil are all provided on a sensor substrate, and wherein the first and second magneto-sensitive elements are formed between the compensation coil and the first to third magnetic layers in a lamination direction on the sensor substrate.

* * * * *